(12) United States Patent
Tavernier et al.

(10) Patent No.: US 10,161,989 B2
(45) Date of Patent: Dec. 25, 2018

(54) FIELD-EFFECT TRANSISTOR AND ASSOCIATED FAULT DETECTION DEVICE

(71) Applicant: RENAULT S.A.S, Boulogne-Billancourt (FR)

(72) Inventors: François Tavernier, St Just St Rambert (FR); Pierre Perichon, Voiron (FR)

(73) Assignee: Renault S.A.S., Boulogne-Billancourt (FR)

( * ) Notice: Subject to any disclaimer, the term of this patent is extended or adjusted under 35 U.S.C. 154(b) by 21 days.

(21) Appl. No.: 15/314,216

(22) PCT Filed: May 26, 2015

(86) PCT No.: PCT/EP2015/061502
§ 371 (c)(1),
(2) Date: Nov. 28, 2016

(87) PCT Pub. No.: WO2015/181112
PCT Pub. Date: Dec. 3, 2015

(65) Prior Publication Data
US 2017/0192049 A1    Jul. 6, 2017

(30) Foreign Application Priority Data
May 27, 2014  (FR) ..................... 14 54808

(51) Int. Cl.
*G01R 31/40* (2014.01)
*G01R 31/26* (2014.01)
(Continued)

(52) U.S. Cl.
CPC ...... *G01R 31/2621* (2013.01); *G01R 31/2812* (2013.01); *G01R 31/2884* (2013.01);
(Continued)

(58) Field of Classification Search
CPC ............ G01R 31/2621; G01R 31/2884; G01R 31/2812; G01R 31/3008; H01L 27/0296
(Continued)

(56) References Cited

U.S. PATENT DOCUMENTS 7,504,849 B2 * 3/2009 Ohshima .......... H03K 17/08122
324/764.01
7,847,702 B2   12/2010 Takahashi
(Continued)

FOREIGN PATENT DOCUMENTS

EP  0 730 347   9/1996
EP  1 801 974   6/2007
(Continued)

*Primary Examiner* — Farhana Hoque
(74) *Attorney, Agent, or Firm* — Occhiuti & Rohlicek LLP

(57) ABSTRACT

An apparatus for anticipating a transistor-fault includes a control circuit that applies a blocking potential of a transistor to its gate using a resistive component, the blocking potential being less than the source and drain potentials. The detection circuit detects a leakage current between the transistor's gate and its source to anticipate a short circuit between them. It does so by measuring the gate-potential while the transistor is blocked. It then compares this measured potential to a reference potential and generates an anomaly signal as a function of this comparison.

11 Claims, 3 Drawing Sheets

(51) Int. Cl.
*H03K 17/12* (2006.01)
*H03K 17/18* (2006.01)
*G01R 31/28* (2006.01)
*G01R 31/30* (2006.01)
*H01L 27/02* (2006.01)

(52) U.S. Cl.
CPC ...... *G01R 31/3008* (2013.01); *H01L 27/0296* (2013.01); *H03K 17/122* (2013.01); *H03K 17/18* (2013.01)

(58) Field of Classification Search
USPC .......................... 324/764.01, 762.09, 757.01
See application file for complete search history.

(56) References Cited

U.S. PATENT DOCUMENTS

| | | | |
|---|---|---|---|
| 2003/0103306 A1 | 6/2003 | Nakazawa et al. | |
| 2010/0237898 A1* | 9/2010 | Kikuta | H02M 1/32 324/764.01 |
| 2011/0193580 A1 | 8/2011 | League | |
| 2012/0248864 A1 | 10/2012 | Ioannidis et al. | |
| 2014/0139206 A1* | 5/2014 | Hirose | G01R 1/06766 324/132 |

FOREIGN PATENT DOCUMENTS

| | | |
|---|---|---|
| EP | 2 458 736 | 5/2012 |
| EP | 2 587 670 | 5/2013 |

\* cited by examiner

FIELD-EFFECT TRANSISTOR AND ASSOCIATED FAULT DETECTION DEVICE

RELATED APPLICATIONS

This application is the national stage under 35 USC 371 of international application PCT/EP2015/061502, filed on May 26, 2015, which claims the benefit of the May 27, 2014 priority date of French application 1454808, the contents of which are herein incorporated by reference.

FIELD OF INVENTION

The invention concerns field effect power transistors and in particular the detection of a short circuit fault of a normally open field effect transistor.

BACKGROUND

Multiple applications make use of field-effect power-transistors of the normally open type that are used in switching. Many applications make use of d.c. voltage, for example, for automobile traction. NMOS power transistors are often used for safety functions, for example, to isolate a connection terminal from a voltage source. When such a power transistor is confronted with a short circuit fault, the voltage source may apply a short circuit current that very rapidly reaches an elevated amplitude. To avoid the serious overheating connected with such a current, it is essential to detect a fault of the transistor in a very short time in order to implement safety measures, in particular, to control the opening of other transistors or prevent their closing.

Among the known fault detection devices, no solution at a reasonable cost has been identified to detect sufficiently rapidly and reliably a fault in a field effect power transistor.

SUMMARY

The invention provides a way to perform early detection of a fault in a field effect transistor before the appearance of a short circuit between scarce and drain.

In one aspect, the invention features an apparatus for anticipating a transistor-fault. Such an apparatus includes a control circuit that applies a blocking potential of a transistor to its gate using a resistive component, the blocking potential being less than the source and drain potentials. The detection circuit detects a leakage current between the transistor's gate and its source to anticipate a short circuit between them. It does so by measuring the gate-potential while the transistor is blocked. It then compares this measured potential to a reference potential and generates an anomaly signal as a function of this comparison.

In another aspect, the invention features an apparatus for anticipating a transistor-fault. Such an apparatus has at least a first transistor, a control circuit, and a detection circuit. The first transistor is a field effect power transistor that is of a normally open type and that has a gate, a source, and a drain. The control circuit includes a resistive component and a control electrode connected together. It uses its resistive component to apply a blocking potential to the transistor's gate. This blocking potential is less than potentials of the transistor's source and its drain. The detection circuit anticipates a short-circuit between the transistor's source and drain by detecting a leakage current between the transistor's gate and its source. It does so by measuring the potential of the gate while the first transistor is blocked and by comparing the measured potential with a reference potential, and then generating an anomaly signal as a function of the resulting comparison.

Embodiments include those in which the first transistor comprises a complementary metal-oxide-silicon transistor and those in which it includes a bipolar transistor having an insulated control terminal or gate. Also among the embodiments are those in which the first transistor is a CMOS transistor and those in which it is a HEMT, those in which it is an IGBT, and those in which it is a JFET.

Some embodiments also include a power switch that opens when the anomaly signal forces it to.

In other embodiments, a channel is made of two materials having different band gaps. In such embodiments, the channel is a constituent of the first transistor. 12.

Also among the embodiments are those in which the resistive component is not constant but can be varied. An example would be an embodiment in which the resistive component comprises a variable resistor.

In yet other embodiments, the detection circuit is configured to generate the anomaly signal based on the measured potential of the gate. Among these are embodiments in which it does so when a measured potential of the gate exceeds the reference potential.

In still other embodiments, the detection circuit generates the anomaly signal when a measured potential of the gate exceeds the reference potential. In at least some of these embodiments, the detection circuit memorizes a measured gate potential and defines the measured potential as being the reference potential.

Other embodiments feature a second transistor connected in parallel with the first transistor. The second transistor is identical in structure to the first. Thus, the second transistor is a field effect power transistor that is of normally open type and that comprises a gate, a source, and a drain. In these embodiments, the detection circuit measures a gate potential of the second transistor during blockage thereof. The detection circuit then generates the anomaly signal in response to determining that a difference between potentials for the gates of the first and second transistors exceeds a threshold.

BRIEF DESCRIPTION OF THE DRAWINGS

Other characteristics and advantages of the invention will emerge clearly from the following description, which is an illustration and in no way limiting, in regard to the enclosed drawings, in which.

DETAILED DESCRIPTION

Figure 1:
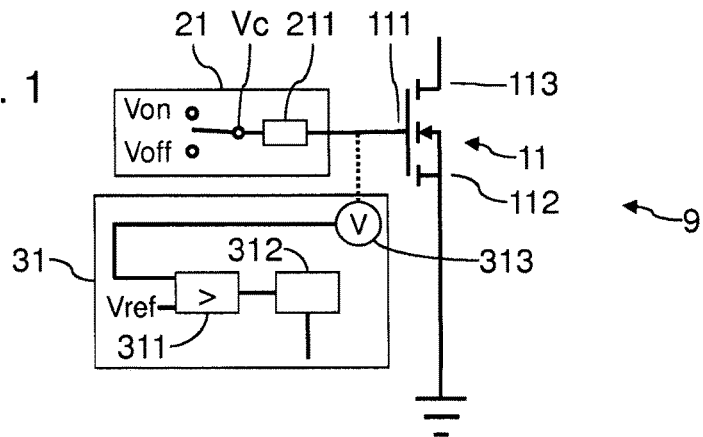
FIG. 1 is a schematic representation of a first embodiment of an electronic device including a field effect power transistor and a short circuit detection circuit.

FIG. 1 is a schematic representation of an electronic device 9 having a field effect power transistor 11 of normally open type. Embodiments of suitable power transistors include those that apply at least a 50 V potential difference between two conduction electrodes, as well as those that apply a voltage of at least equal to 100 V across the two electrodes, and those that are configured to be traversed by a current of at least 5 A, and in some cases, at least equal to 10 A.

In this embodiment, the transistor 11 is an N-type metal-oxide-silicon field-effect transistor having a gate 111 that forms a control electrode, a source 112 that forms a first conduction electrode, and a drain 113 that forms a second conduction electrode. The source 112, at least in FIG. 1, is connected to a ground potential.

The electronic device 9 also includes a control circuit 21 that is adapted to apply a control potential to the gate 111, thereby selectively opening or closing the transistor 11. The control circuit 21 thus applies a potential to a control node VC. The value of this voltage is either an unblocking potential $V_{on}$ of the transistor 11 or an blocking potential $V_{off}$ of the transistor 11.

The control circuit 21 includes a resistive component 211 connected between the control node VC and the gate 111. In the illustrated embodiment, the resistive component 211 is purely resistive.

In some embodiments, the resistive component 211 includes two branches, each of which includes a diode and a resistor. The diodes are connected in antiparallel. The resistors of each branch can have different values. These different values make it possible for the transistor 11 to have different opening and closing speeds.

The electronic device 9 also includes a detection circuit 31 for detecting a short circuit between the source 112 and the drain 113. The detection circuit 31 includes a voltmeter 313 to measure the potential of the gate 111. This measurement can be made by measuring a potential difference between the gate 111 and the source 112.

The detection circuit 31 also includes a comparator 311 and a processing circuit 312. The voltmeter 313 applies the measured potential at an input of the comparator 311. The comparator 311 also receives a reference value $V_{ref}$ at another input thereof. In response to its two inputs, the comparator 311 generates an output signal that depends on the comparison between the measured potential and the reference value $V_{ref}$. The processing circuit 312 receives the output signal of the comparator 311. Depending on the level of this output signal, the processing circuit 312 may generate an anomaly signal to indicate the existence of an anomaly. The anomaly signal can be used to warn of the consequences of the anomaly. For example, the anomaly signal can be used to trigger operation of safety switches, to open other transistors, or to prevent other transistors from closing.

The electronic circuit 9 detects appearance of a fault during the blocked or open state of the field-effect transistor 11. In particular, the electronic circuit 9 provides a way to anticipate the appearance of a short circuit between source 112 and drain 113 by detecting, in advance, an abnormal leakage current between the gate 111 and the source 112. It does so by exploiting the result of simulating the aging of metal-oxide-silicon field-effect transistor power transistors of normally open type by subjecting such transistors to switching cycles in the absence of heat dissipaters to accelerate aging thereof. Upon studying the appearances of faults in these transistors, the inventors systematically discovered initial faults in the form of a short circuit. The inventors also discovered that the faults occurred systematically when the transistor was in the open state or being switched to the open state. The inventors also discovered that nearly all of the faults ended up with a degradation of the electrical insulator between the gate and the source of the transistors.

Usually, a field effect transistor 11 is made to remain open by applying a control potential such that the potential difference between the transistor's control-electrode and its first conduction-electrode is zero. This ensures that this potential difference remains less than the threshold voltage of this transistor 11.

In the embodiment shown in FIG. 1, the control circuit 21 applies a blocking potential $V_{off}$ to the control node VC. This blocking potential $V_{off}$ is less than the potential of the source 112 and the drain 113. The control circuit 21 is thus configured to cause a negative potential difference between the transistor's gate 111 and its source 112. This blocks the transistor 11.

In some embodiments, the blocking potential $V_{off}$ is less than 0.2 V as compared to the potential of each of the conduction electrodes 112, 113. Further embodiments include those in which the blocking potential $V_{off}$ is less than 0.5 V, as well as those in which the blocking potential $V_{off}$ is less than the value of the threshold voltage.

Figure 2:
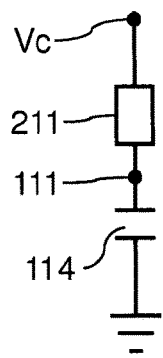
FIGS. 2 and 3 are schematic representations of the electrical behavior of the transistor and its control circuit, in the absence and in the presence of a malfunction.
Figure 3:
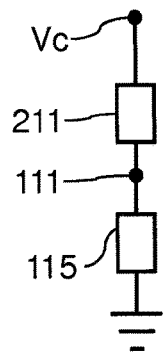

To facilitate the understanding of the use of such a blocking potential, FIGS. 2 and 3 show schematically the electrical behavior of the transistor 11 and its control circuit 21 between the control node VC and the source 112.

FIG. 2 models the transistor 11 with no malfunction. Between its gate 111 and its source 112, the transistor behaves as if there were an electrical insulator. As such, it is convenient to model the circuit as a capacitor 114 in series with the resistive component 211.

FIG. 3 models a malfunction in the transistor 11. This malfunction is one that arises from degradation of the electrical insulator between the gate 111 and the source 112. As such, it is convenient to model the structure between the transistor's gate 111 and its source 112 a resistor 115. This forms a voltage-dividing bridge between the control node VC and the source 112.

In the state illustrated in FIG. 3, due to the application of a nonzero potential difference between the control node VC and the source 112, the resistor 115 causes a difference between the potential applied to the control node VC and the potential applied to the gate 111.

If the gate-potential measured at the gate 111 exceeds the reference value $V_{ref}$, the comparator 311 furnishes a corresponding output signal to the processing circuit 312. Following its receipt of this corresponding output signal, the processing circuit 312 determines that the gate-potential measured exceeds the reference value $V_{ref}$ when the transistor 11 is open, and thus differs from the potential of the control node 21. In response, the processing circuit 312 generates an anomaly signal.

The processing circuit 312 need not rely solely on the corresponding output signal from the comparator 311. It may take other conditions into account before generating an anomaly signal. For example, the processing circuit 312 may wait until the comparator 311 has signaled the crossing of the reference value $V_{ref}$ for a sufficient time. This will avoid untimely triggering during transitional phases.

Figure 4:
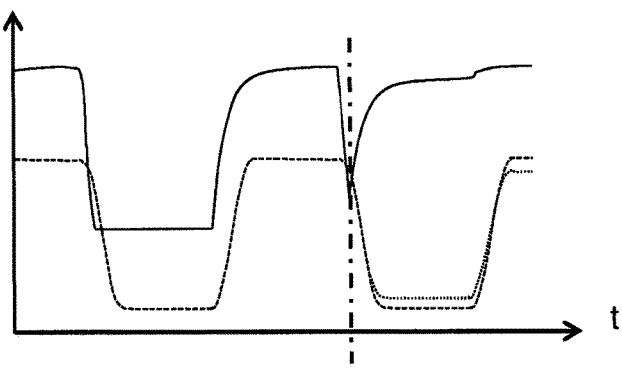
FIG. 4 illustrates the variation of parameters of the transistor of FIG. 1 upon appearance of a short circuit.

In FIG. 4, a solid curve shows the current passing through a field effect transistor. A dashed curve and a dotted curve show the transistor's gate-potential. The figure shows these potentials during several consecutive switching operations. The dashed curve corresponds to the transistor's gate-potential in the absence of malfunction. The dotted curve corresponds to the transistor's gate-potential in the presence of a short circuit.

When the transistor 11 opens, a short circuit appears and the transistor, which is assumed to be open, is traversed by a current. During the phase when the control circuit applies an opening potential to the transistor's gate 111, the potential effectively applied to the gate 111 is greater than what it would be in the absence of a short circuit. This difference arises from the resistive behavior between the gate 111 and the source 113. When the transistor 11 later closes, the gate-potential is, however, less than what it should be in the absence of a short circuit. It is these abnormal gate-potentials that the voltmeter 313 detects.

Because of its ability to rapidly and reliably detect a short circuit, the electronic device 9 makes it possible to use a field effect power transistor 11 in safety applications. Moreover, the electronic device 9 does not carry out this detection when the transistor 11 closes, by which point it may be too late to do anything about it. Instead, it carries out the detection when the transistor 11 opens. As a result, the electronic circuit 9 detects the short circuit as soon as possible. This is especially important because a short circuit is statistically more likely to occur during the transistor's opening.

In fact, the arrangement electronic circuit 9 can be viewed as doing more than simply detecting a short circuit. It can also be viewed as foretelling it. This is because as the insulator between the gate 111 and the source 112 deteriorates over time, it causes a subtle but detectable change in leakage current. This change in leakage current occurs even before an actual short circuit occurs. As such, the electronic circuit 9 is able to detect an increase in the likelihood of a short circuit between the source 112 and the drain 113 before it actually occurs.

The measurement of the gate-potential as carried out by the electronic circuit 9 offers several advantages. First of all, it avoids false alarms that might be encountered by using the potential difference between the source 112 and the drain 113 to detect a short circuit. Second, it makes it possible to avoid measuring an elevated potential difference. Third, measuring a potential is much less costly than attempting to measure gate-current to rapidly detect a short circuit. And finally, circuitry for measurement of the gate-potential can easily be integrated into the control circuit 21.

The resistance value of the resistive component 211 affects the sensitivity of the short-circuit detection. The higher this the resistance of the resistive component 211, the greater will be the variation in the gate-potential during a malfunction. This makes it easier to detect this malfunction.

On the other hand, an elevated resistance at the resistive component 211 reduces the transistor's switching speed.

To ameliorate this difficulty, and to thus obtain the best of both worlds, it is possible to deploy an embodiment in which there are two branches, each of which has its own resistive component 211. The branch having the more resistive resistive-component 211 is the one that opens the transistor 11. The branch having the less resistive resistive-component 211 is the one that closes the transistor 11. As a result, only the transistor's opening speed will be slowed down.

Figure 5:
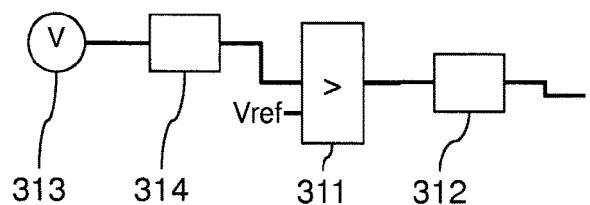
FIG. 5 illustrates schematically one variant of a detection circuit.

FIG. 5 illustrates one alternative embodiment of the defection circuit 31 having a filter 314 between the voltmeter 313 and the comparator 311. The filter 314 eliminates transitory voltage peaks, thereby reducing the probability of false alarms. A suitable filter 314 is a low pass filter having a cutoff frequency that is then less than the equivalent switching frequency of the transistors and that is low enough to allow a reduced fault detection time. An example of a suitable cutoff frequency is 500 kHz for a detection time in the order of 10 μs.

Figure 6:
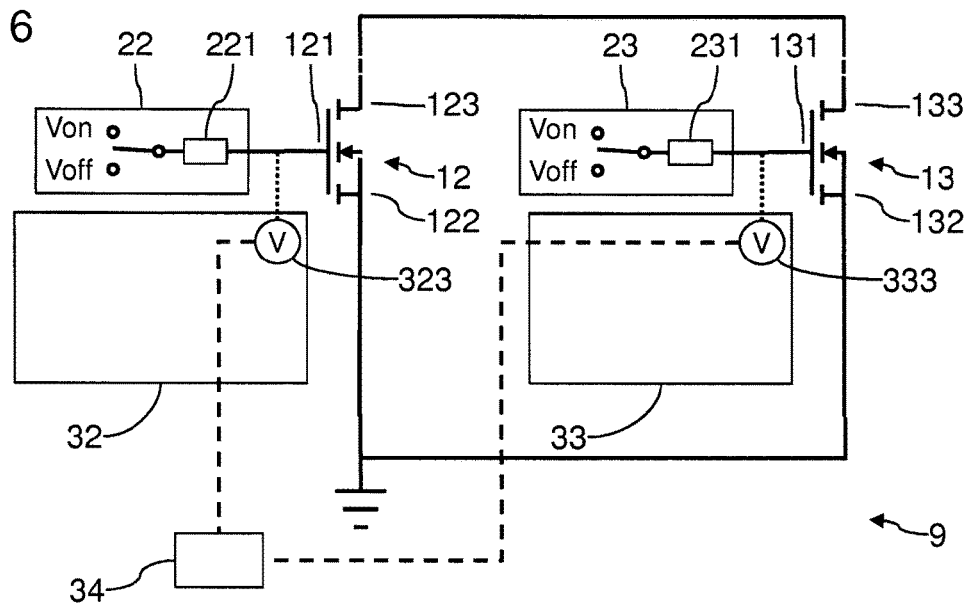
FIG. 6 is a schematic representation of a second embodiment of an electronic device including two field effect power transistors connected in parallel and a short circuit detection circuit.

FIG. 6 is a schematic representation of an electronic device 9 according to a second embodiment of the invention. The electronic device 9 includes a first transistor 12 and a second transistor 13, both of which are field effect power transistors that are normally open. The first transistor 12 has a first-transistor gate 131, a first-transistor source 122, and a first-transistor drain 123. Similarly, the second transistor 13 has a second-transistor gate 131, a second-transistor source 132, and a second transistor drain 133. The first and second transistors 12, 13 are thus identical in structure to the transistor 11 shown in FIG. 1.

As can be seen in FIG. 6, the first-transistor source 122 and the second-transistor source 132 both connect to a first potential, and the first-transistor drain 123 and the second-transistor drain 133 both connect to a second potential. Accordingly, the first and second transistors 12, 13 are connected in parallel.

The electronic device 9 also includes a first control circuit 22 having a first resistive component 221 and a second control circuit 23 that has a second resistive component 231. The first control circuit 22 applies a control potential to the first-transistor gate 121. The second control circuit 23 applies a control potential to the second-transistor gate 131. The first and second control circuits 22, 23 are synchronized to simultaneously apply a blocking potential $V_{off}$ or an unblocking potential $V_{on}$ to the control nodes VC of the corresponding first and second transistors 12, 13. The first resistive component 221 connects between the first transistor's control node and the first-transistor gate 121. Similarly, the second resistive component 231 connects between the second transistor's control node and the second-transistor gate 131. In some embodiments, a single control circuit with two outputs replaces the first and second control circuits 22, 23.

The electronic device 9 shown in FIG. 6 also includes a first measurement-circuit 32 having a first voltmeter 323 for measuring the potential at the first-transistor gate 121, and a second measurement circuit 33 having a second voltmeter 333 for measuring the potential at the second-transistor gate 131. A detection circuit 34 receives the potentials measured by the first and second voltmeters 323 and 333.

Figure 7:
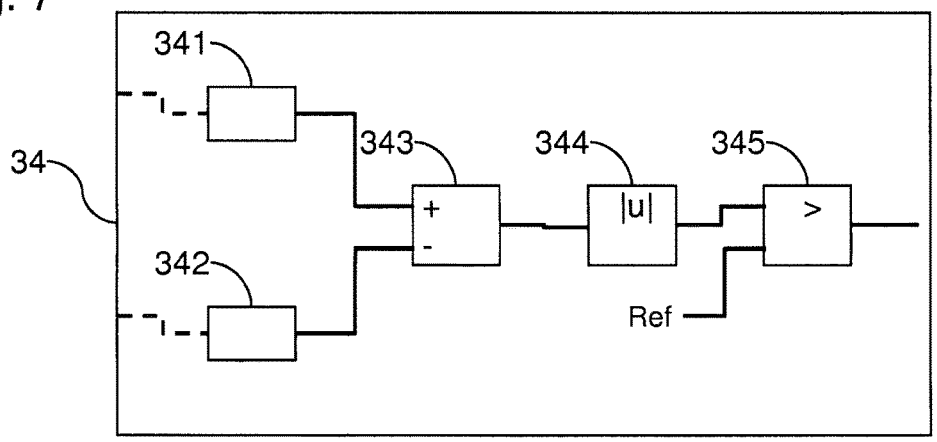
FIG. 7 shows schematically functions of the detection circuit of FIG. 6.

FIG. 7 shows schematically different functions of an example of the detection circuit 34 of the electronic device 9 of FIG. 6. The detection circuit 34 includes first and second filter circuits 341, 341. The first filter circuit 341 has an input that receives the potential measured by the first voltmeter 323. Similarly, the second filter circuit 342 has an input that receives the potential measured by the second voltmeter 333. The first and second filter circuits 341, 342 eliminate transitory voltage peaks that might cause untimely false detections.

The detection circuit 34 also includes a differencing circuit 343 that receives, at its two inputs, first and second filtered potentials from the first and second filter circuits 341, 342. The differencing circuit 343 outputs a difference between the first and second filtered potentials and provides it to an absolute-value circuit 344. The absolute-value circuit 344 outputs an absolute value of the difference between the first and second filtered potentials. It is this absolute value that a comparator 345 receives at its first input. A second input of the comparator 345 receives a threshold Ref. When the absolute value of the difference exceeds the threshold Ref, the comparator 345 outputs an anomaly signal.

The second embodiment exploits the fact that there is an extremely low probability of both the first and second transistors 12, 13 having a simultaneous short circuit fault. Consequently, the gate-potential of the first transistor 12 serves as a comparison for detecting an abnormality in the second transistor 13 and vice versa. A non-faulty transistor thus serves as a comparison reference for detecting an abnormal gate-potential of a short circuited transistor. It may be noted that, upon destruction of one of the first and second transistors 12, 13, the remaining one is still available to carry all of the current. This second embodiment in particular promotes more reliable detection of a short circuit by avoiding dispersions between the transistors and dispersions associated with aging of such transistors.

Figure 8:
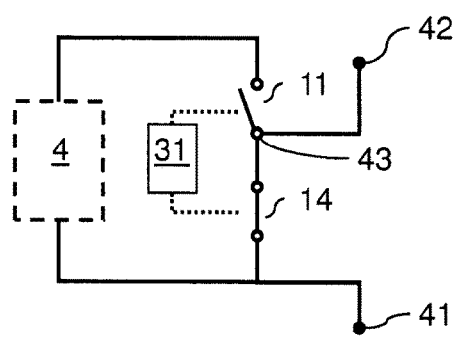
FIGS. 8 and 9 illustrate a system including a field effect power transistor and its detection circuit, in two operating states.
Figure 9:
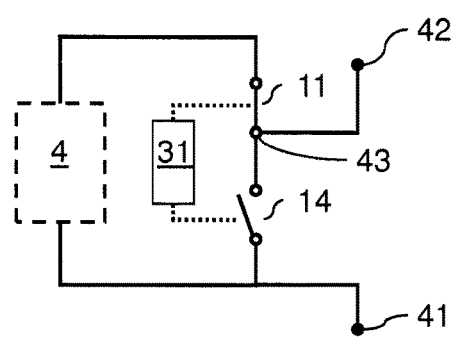

FIGS. 8 and 9 illustrate a system including a field effect power transistor 11 of normally open type and its detection circuit 31. The system further includes a dc voltage source 4, such as an array of electrochemical batteries, and a control-switch 14, for example, a field effect power transistor.

The system includes first and second poles 41, 42, and two branches connected in parallel between the first and second poles 41, 42. A first branch includes the transistor 11 and the dc voltage source 4 connected in series. A second branch includes the control-switch 14, configured for example as a normally closed switch. A node 43 connects the control-switch 14 and the transistor 11.

FIG. 8 shows the system in a first configuration in which the opened transistor 11 isolates the positive terminal of the dc voltage source 4 from the second pole 42. Meanwhile, the negative terminal of the dc voltage source 4 remains connected to the first pole 41. Closing the control-switch 14 ensures that the potential difference between the first and second poles 41, 42 is zero.

In FIG. 9, the system is in a second configuration in which it supplies power supply to an electrical load. In this second configuration, the positive terminal of the now-closed transistor 11 connects the dc voltage source 4 to the second pole 42. Meanwhile, the now-opened control-switch 14 isolates the second pole 42 and the node 43 from the first pole 41.

In the configuration of FIG. 8, there exists a risk that a short-circuit in the transistor 11 will permit the dc voltage source 4 to pass a short circuit current through the transistor 11 and the closed control-switch 14. To prevent this, when the control circuit 31 detects the appearance of a short circuit at the transistor 11, it generates an anomaly signal. This anomaly signal controls the opening of the control-switch 14 or prevents the closing of this control-switch 14. This will maintain the system in the second configuration, shown in FIG. 9. This second configuration prevents the dc voltage source 4 from producing a short circuit current.

Figure 10:
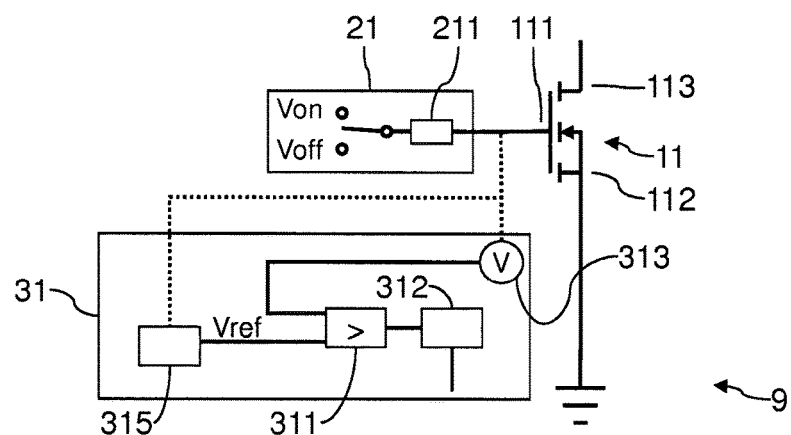
FIG. 10 is a variant of the electronic device of FIG. 1.

In some variants of the embodiment shown in FIG. 1, the reference value $V_{ref}$ is variable. The reference value $V_{ref}$ can therefore be set in different ways. FIG. 10 illustrates one variant of an electronic device 9 according to the first embodiment.

In the embodiment shown in FIG. 10, the detection device 31 includes a buffer memory 315. The buffer memory 315 receives a potential measured by the voltmeter 313 during an opening phase of the transistor 11. The buffer memory 315 applies this measured value at its output with a time shift. Thus, the reference value $V_{ref}$ is defined by a previous measurement of the potential on the gate 111.

The reference value $V_{ref}$ can likewise be generated by a capacitance designed to model the structure between the gate 111 and the source 112.

In some embodiments, the resistive components 211, 221, 231 are variable resistors. Among these are embodiments in which the resistance of these variable resistors is adjusted as a function of the desired detection sensitivity, without systematically sacrificing the dynamics of switching of the power transistor.

In the examples described above, the field effect power transistor of normally open type is a metal-oxide-silicon field-effect transistor, such as a complementary metal-oxide-silicon field-effect transistor. However, different transistors can be used. For example, the transistor may be one that has a channel comprising a junction between materials of different band gaps. In other embodiments, the transistor is a bipolar transistor having an insulated gate. In yet other embodiments, the transistor is a junction field-effect transistor. In yet other embodiments, the transistor is a depletion mode device. The transistor can be any field effect power transistors of normally open type, such as those that rely on CMOS, HEMT, IGBT, or JFET technology. For all of these types of transistor, a fault of the insulator of the control electrode can result in a short circuit.

The invention has been described primarily in an application to a system including a battery, with a power transistor of normally open type used as a serial switch for this battery. However, an electronic device according to the invention can involve many other applications, for example by connecting such transistors in the bridge arms of inverters, for example for electric motorization applications.

The invention claimed is:

1. An apparatus for anticipating a transistor-fault, said apparatus comprising a first transistor, a control circuit, and a detection circuit, wherein said first transistor is a field effect power transistor that is of a normally open type, wherein said first transistor comprises a gate, a source, and a drain, wherein said control circuit comprises a resistive component and a control electrode, wherein said resistive component connects to said control electrode, wherein said control circuit is configured to apply a blocking potential of said first transistor to said gate using said resistive component, wherein said blocking potential is less than potentials of said source and said drain, wherein said detection circuit is configured to detect a leakage current between said gate and said source in order to anticipate a short circuit between said source and said drain, wherein said detection circuit is configured to measure said potential of said gate while said first transistor is blocked, wherein said detection circuit is configured to compare said measured potential to a reference potential, thereby generating a comparison, and wherein said detection circuit is configured to generate an anomaly signal as a function of said comparison.

2. The apparatus of claim 1, wherein said first transistor comprises a complementary metal-oxide-silicon transistor.

3. The apparatus of claim 1, further comprising a power switch, wherein said anomaly signal forces opening of said power switch.

4. The apparatus of claim 1, wherein said first transistor comprises a bipolar transistor, wherein said bipolar transistor has an insulated gate.

5. The apparatus of claim 1, further comprising a channel made of a first material and a second material, wherein said first and second material have different band-gaps, wherein said channel is a constituent of said first transistor.

6. The apparatus of claim 1, wherein said first transistor comprises a high-electron-mobility transistor.

7. The apparatus of claim 1, wherein said resistive component comprises a variable resistor.

8. The apparatus of claim 1, wherein said detection circuit is configured to generate said anomaly signal when a measured potential of said gate exceeds said reference potential.

9. The apparatus of claim 1, wherein said detection circuit is configured to generate said anomaly signal when a measured potential of said gate exceeds said reference potential, wherein said detection circuit is configured to memorize a measured gate potential and to then define said measured potential as being said reference potential.

10. The apparatus of claim 1, further comprising a second transistor, wherein said first and second transistors are connected in parallel, wherein said second transistor is a field effect power transistor that is of normally open type and that comprises a gate, a source, and a drain, wherein said detection circuit is configured to measure a gate potential of said second transistor during blockage thereof, wherein said detection circuit is configured to generate said anomaly signal in response to determining that a difference between potentials for said gates of said first and second transistors exceeds a threshold.

11. The apparatus of claim 1, wherein said first transistor comprises a junction field-effect transistor.

\* \* \* \* \*